US009923036B2

(12) United States Patent
Kim et al.

(10) Patent No.: US 9,923,036 B2
(45) Date of Patent: Mar. 20, 2018

(54) THIN FILM TRANSISTOR ARRAY SUBSTRATE AND METHOD OF FABRICATING THE SAME

(71) Applicant: LG Display Co., Ltd., Seoul (KR)

(72) Inventors: Kang Hyun Kim, Paju-si (KR); Ki Soub Yang, Paju-si (KR); Seung Ryul Choi, Goyang-si (KR); Kyoung Jin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/632,881

(22) Filed: Jun. 26, 2017

(65) Prior Publication Data

US 2017/0294494 A1  Oct. 12, 2017

Related U.S. Application Data

(62) Division of application No. 14/875,023, filed on Oct. 5, 2015, now Pat. No. 9,748,319.

(30) Foreign Application Priority Data

Dec. 16, 2014 (KR) .......................... 10-2014-0181328

(51) Int. Cl.
| H01L 27/32 | (2006.01) |
| H01L 51/00 | (2006.01) |
| H01L 51/50 | (2006.01) |
| H01L 27/12 | (2006.01) |

(52) U.S. Cl.
CPC ........ *H01L 27/3246* (2013.01); *H01L 27/322* (2013.01); *H01L 27/3262* (2013.01); *H01L 51/0003* (2013.01); *H01L 51/0012* (2013.01); *H01L 27/1214* (2013.01); *H01L 51/5012* (2013.01); *H01L 2227/323* (2013.01)

(58) Field of Classification Search
CPC ........... H01L 21/02107; H01L 27/3246; H01L 27/322; H01L 27/3262; H01L 27/1214; H01L 51/0012; H01L 51/0003; H01L 51/5012
See application file for complete search history.

(56) References Cited

U.S. PATENT DOCUMENTS

2008/0230772 A1* 9/2008 Kamiura ............. H01L 51/0004
257/40

FOREIGN PATENT DOCUMENTS

| KR | 10-2004-0058454 A | 7/2004 |
| KR | 10-2010-0067761 A | 6/2010 |
| KR | 10-2011-0023996 A | 3/2011 |
| TW | 200733374 A | 9/2007 |
| TW | 200952545 A | 12/2009 |
| TW | 201031248 A | 8/2010 |

* cited by examiner

*Primary Examiner* — Douglas Menz
(74) *Attorney, Agent, or Firm* — Dentons US LLP (57) ABSTRACT

Disclosed is a display device that may include a thin film transistor array substrate that includes a plurality of first sub-pixels and a plurality of second sub-pixels, wherein one of the plurality of first sub-pixels includes a first emission region and a first non-emission region, and one of the plurality of second sub-pixels includes a second emission region and a second non-emission region; a first bank pattern in the first and second non-emission regions, the first bank pattern including a hydrophilic material; and a second bank pattern on an upper surface of the first bank pattern, the second bank pattern includes a hydrophobic material.

12 Claims, 10 Drawing Sheets

THIN FILM TRANSISTOR ARRAY SUBSTRATE AND METHOD OF FABRICATING THE SAME

This application is a Divisional of application Ser. No. 14/875,023, filed Oct. 5, 2015, which claims the benefit of, and priority to, Korean Patent Application No. 10-2014-0181328 filed on Dec. 16, 2014, the contents of each of which are hereby incorporated by reference for all purposes as if fully set forth herein.

BACKGROUND OF THE INVENTION

Field of the Invention

The present invention relates to a display device and a method of manufacturing the same. More specifically, the present invention relates to a thin film transistor array substrate and a method of manufacturing the same.

Discussion of the Related Art

As the information society continues to developed, various types of display devices are in increasing demand. In accordance therewith, a variety of flat panel display devices such as liquid crystal display (LCD) devices, plasma display panels (PDP), organic light emitting diode (OLED) display devices and so on are being recently used.

Among these flat panel display devices, OLED display devices are being widely used these days, because they have features such as lightweight, slimness, low power consumption, and so on. OLED display devices are classified into a RGB-mode and a white mode. The RGB mode OLED display device includes red, green and blue organic emission layers which are disposed red, green and blue sub-pixels and emit red, green and blue lights, respectively. The white mode (W-mode) OLED display device includes an organic emission layer and red, green and blue color filters. The organic emission layer is disposed in red, green and blue sub-pixels and emits white light. The red, green and blue color filters are formed in the red, green and blue sub-pixels.

As the definition of OLED display devices becomes higher, not only does the size of the pixels become smaller, but also the line width of a bank pattern becomes narrower. As such, when the organic emission layer of an OLED display device is formed from a liquefied organic emission material, organic emission materials formed in different, neighboring sub-pixels can be mixed with one another due to the narrowed line width of the bank pattern used as a barrier.

As the distances between the sub-pixels become smaller due to its increased resolution, a color blending between the red, green and blue sub-pixels of an OLED display may occur within a viewing angle, where a viewer perceives different colors depending on the angles at which the viewer views the OLED display. Due to this color blending, the picture quality may deteriorate.

SUMMARY OF THE INVENTION

Accordingly, the present invention is directed to provide a display device and method of manufacturing the same that substantially obviates one or more problems due to limitations and disadvantages of the related art.

An advantage of the present invention is directed to provide an organic light emitting diode (OLED) display device with improved color representation.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may, for example, include a thin film transistor array substrate that includes a plurality of first sub-pixels and a plurality of second sub-pixels, wherein one of the plurality of first sub-pixels includes a first emission region and a first non-emission region, and one of the plurality of second sub-pixels includes a second emission region and a second non-emission region; a first bank pattern in the first and second non-emission regions, the first bank pattern including a hydrophilic material; and a second bank pattern on an upper surface of the first bank pattern, the second bank pattern includes a hydrophobic material.

In another aspect of the present invention, a method of manufacturing an organic light emitting diode (OLED) display device having a thin film transistor array substrate may, for example, include forming a first sub-pixel including a first emission region and a first non-emission region on a substrate; forming a second sub-pixel adjacent to the first sub-pixel, the second sub-pixel including a second emission region and a second non-emission region; forming a first bank pattern with a hydrophilic inorganic insulation material in the first and second non-emission regions; forming a second bank pattern with a hydrophobic organic insulation material on an upper surface of the first bank pattern; and forming an organic emission layer on the first and second emission regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings. In the drawings, the size, thickness, and so on of an element may be exaggerated for convenience of explanation. Wherever possible, the same reference numbers will be used throughout this disclosure to refer to the same or like parts.

Figure 1:
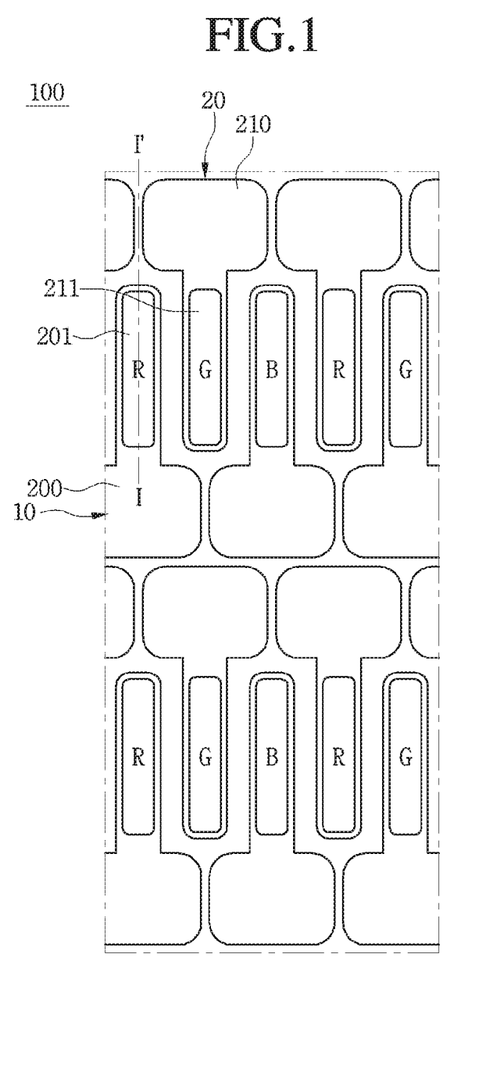
FIG. 1 is a planar view illustrating an OLED display device according to the first embodiment of the present invention.

FIG. 1 is a planar view illustrating an OLED display device according to the first embodiment of the present invention.

Referring to FIG. 1, an OLEO display device includes a plurality of sub-pixels which are arranged on a substrate 100. In detail, the OLED display device includes a plurality of first sub-pixels 10 and a plurality of second sub-pixels 20 that are arranged in horizontal direction of the substrate 100.

The first sub-pixels 10 and the second sub-pixels 20 are arranged alternately with each other in the horizontal direction of the substrate 100. Also, each of the first and second sub-pixels 10 and 20 can become one of red, green and blue sub-pixels. For example, one second sub-pixel 20 emitting a green light is disposed by one side edge of the first sub-pixel 10 emitting a red light, and another first sub-pixel 10 emitting a blue light is disposed by one side edge of the second sub-pixel 20, which emits a green light, opposite to the first sub-pixel emitting the red light. In this manner, the OLED display device including the plurality of sub-pixels can be implemented.

The first sub-pixel 10 includes an emission region (hereinafter, "first emission region") 201 and a non-emission region (hereinafter, "first non-emission region") 200. The second sub-pixel 20 includes an emission region (hereinafter, "second emission region") 211 and a non-emission region (hereinafter, "second non-emission region") 210. The first emission region 201 and the second emission region 211 are disposed between the first non-emission region 200 and the second non-emission region 210.

In other words, the first emission region 201 is disposed by one side edge of the second emission region 211, and another first emission region 201 is disposed by the other side edge of the second emission region 211. Also, one first non-emission region 200 is interposed between two different first non-emission regions 200. Moreover, one second non-emission region 210 is interposed between two different second non-emission regions 210.

The first non-emission region 200 and the second non-emission region 210 can be defined to have wider areas than those of the first emission region 201 and the second emission region 211. The widths of the first non-emission region 200 and the second non-emission region 210 can become larger than those of the first emission region 201 and the second emission region 211.

The first non-emission region 200 can have the same width as the second non-emission region 210. Also, the first emission region 201 can have the same width as the second emission region 200. The first non-emission region 200 and the second non-emission region 210 can be defined to have greater widths than those of the first emission region 201 and the second emission region 211.

Although it is not shown in the drawing, a first bank pattern formed of a hydrophilic inorganic material can be disposed on the first non-emission region 200 and the second non-emission region 210. Also, a second bank pattern can be disposed on a part of the surface of the first bank pattern. An organic emission layer formed from a liquefied organic emission material is disposed on a domain surrounded with the second bank pattern.

The domain surrounded with the second bank pattern can include the first emission region 201 and the second emission region 211. In this case, the second bank pattern can be used as a barrier that reduces or prevents organic emission layers disposed on the sub-pixels from being mixed with one another.

When the OLED display device has a high resolution, the size of its sub-pixel regions becomes smaller and components disposed on each sub-pixel region are also small-sized. In other words, as the resolution of the OLED display device becomes higher, the line width of the second bank pattern becomes narrower. The narrow line width of the second bank pattern may cause different organic emission materials to be mixed with one another when an organic emission layer of the high definition OLED display device is formed using liquefied organic emission materials.

To address this issue, the OLED display device according to an embodiment of the present invention allows organic emission materials to be coated or formed on the first non-emission region 200 of the first sub-pixel 10 and the second non-emission region 210 of the second sub-pixel 20. The organic emission materials coated or firmed on the first non-emission region 200 and the second non-emission region 210 are diffused into the first emission region 201 and the second emission 211, through which organic emission layers can be formed on the first emission region 201 and the second emission region 211.

In the OLED display device, a liquefied organic emission material is coated on the first non-emission region 200, which has a greater width than that of the first emission region 201, and is then diffused into the first emission region 201. As such, an organic emission layer can be disposed on the first emission region 201. Also, in order to dispose an organic emission layer on the second emission region 211, another liquefied organic material is coated on the second non-emission region 210, which has a greater width than that of the second emission region 211, and is then diffused into the second emission region 211.

By doing so, different liquefied organic emission materials can be disposed on different stab-pixels of the OLED display device having a high resolution in such a manner as to be not mixed with one another. This will now be described with reference to FIG. 2, which is a cross-sectional view taken along line I-I' in FIG. 1.

Figure 2:
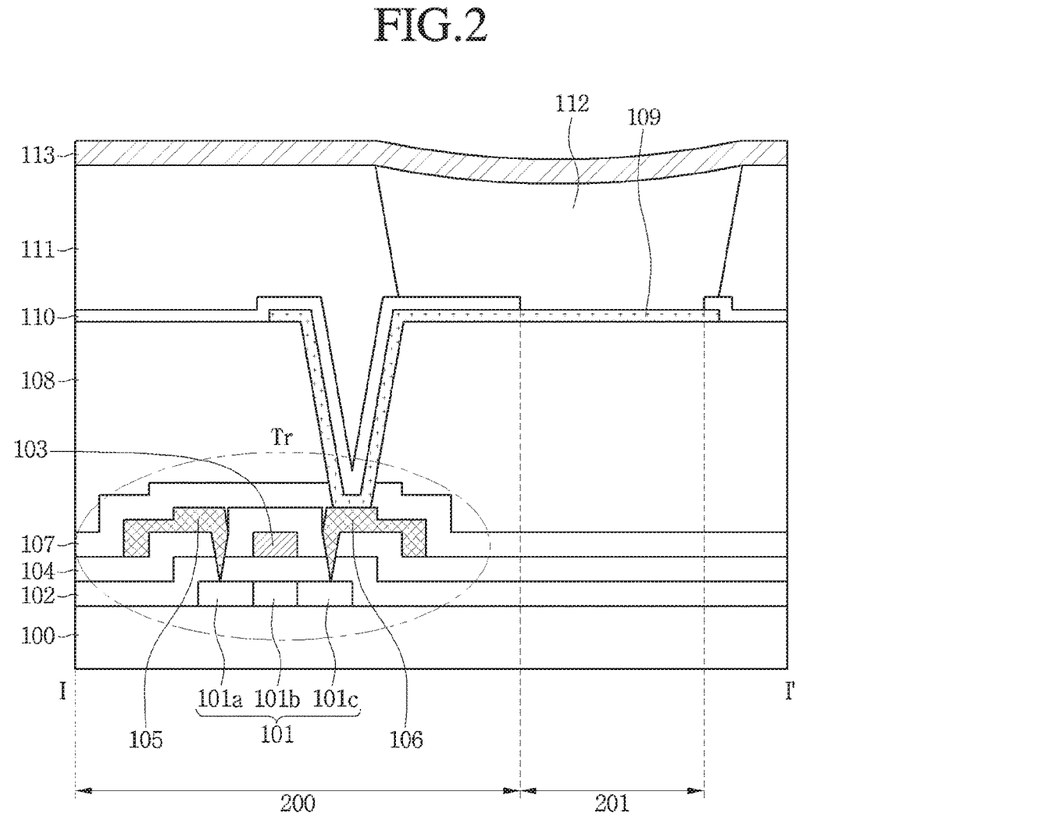
FIG. 2 is a cross-sectional view illustrating a first sub-pixel of the OLED display device taken along line I-I' in FIG. 1.

FIG. 2 is a cross-sectional view illustrating the first sub-pixel of the OLED display device taken along line I-I' in FIG. 1.

Referring to FIG. 2, a thin film transistor Tr and an organic light emitting element are disposed on the substrate 100. The thin film transistor Tr includes a semiconductor layer 101, a gate electrode 103, a source electrode 105 and a drain electrode 106. The organic light emitting element includes a first electrode 109, an organic emission layer 112 and a second electrode 113.

The semiconductor layer 101 of the thin film transistor Tr is disposed on the substrate 100, which includes a source region 101a, a channel region 101b and a drain region 101c. A gate insulation film 102 is disposed on an entire surface of the substrate 100 provided with the semiconductor layer 101. The gate electrode 103 of the thin film transistor Tr is disposed on the gate insulation film 102. Also, the gate electrode 103 is disposed in such a manner as to overlap with the channel region 101b.

Air interlayer insulation film 104 is disposed on an entire surface of the substrate 100 provided with the gate electrode 103. The source electrode 105 and the drain electrode 106 of the thin film transistor Tr are disposed on the interlayer insulation film 104. Also, the source electrode 105 and the drain electrode 106 are connected to the source region 101a and the drain region 101c of the semiconductor layer 101 via contact holes, each penetrating through the interlayer insulation film 104 and the gate insulation film 102. In this manner, the thin film transistor Tr is disposed (or formed) on the substrate 100.

A passivation film 107 is disposed on an entire surface of the substrate 100 provided with the thin film transistor Tr. Also, a planarization film 108 is disposed on the passivation film 107.

The first electrode 109 of the organic light emitting element is disposed on a part of the surface of the planarization film 108 in such a manner as to be connected to the drain electrode 106 of the thin film transistor Tr. The first electrode 109 is used as an anode electrode of the organic light emitting element, but it is not limited to this example. In other words, the first electrode 109 can be used as a cathode electrode of the organic light emitting element.

A first bank pattern 110 is disposed on the planarization film 108 provided with the first electrode 109. In detail, the first bank pattern 110 can be disposed in such a manner as to overlap with edges of the first electrode 109. As such, a part of the surface of the first electrode 109 can be exposed through the first bank pattern 110. The first bank pattern 110 can be formed of a hydrophilic inorganic insulation material.

Also, the first bank pattern 110 can define a first emission region 201 and a first non-emission region 200 of the first sub-pixel. The first emission region 201 can be a region not occupied by the first bank pattern 110. The first non-emission region 200 can be a remaining region that is occupied by not only the first bank pattern 110 but also the thin film transistor Tr.

A second bank pattern 111 overlapping with the first bank pattern 110 is disposed. The second bank pattern 111 can have a greater thickness and a narrower width compared to the first bank pattern 110. The second bank pattern 111 can be formed of a hydrophobic organic insulation material.

The organic emission layer 112 is disposed on a region that is surrounded (or defined) by the second bank pattern 111. The organic emission layer 112 can be formed from a liquefied organic emission material. When the organic emission layer 112 is formed from a liquefied organic emission material, not only can a large-sized display device be effectively fabricated, but also the manufacturing process can be simplified.

The liquefied organic emission material can be coated on the first non-emission region 200. In detail, the liquefied organic emission material can be coated on the first bank pattern 110 within the first non-emission region 200.

The liquefied organic emission material coated on the first bank pattern 110 within the first non-emission region 200 can be diffused from the first bank pattern 110, which is formed of a hydrophilic inorganic insulation material, into the first electrode 109 due to its hydrophilicity. As a result, the organic emission layer 200 can be disposed (or formed) on the first emission region 201 of the first sub-pixel and the exposed surface of the first bank pattern 110, which is disposed in the first non-emission region 200 of the first sub-pixel.

The first non-emission region 200 of the first sub-pixel can be defined to have a greater width than that of the first emission region 201. As such, any color blending between different sub-pixels can be reduced or prevented, even when the definition of the OLED display device becomes higher.

When liquefied organic emission materials are coated on the emission regions of a high definition OLED display device according to the related art, the color blending problem may occur. However, in the OLED display device according to an embodiment of the present invention, the organic emission layer 112 is formed on the first emission region 201 by coating a liquefied organic emission material on the first non-emission region 200 with a greater width than the first emission region 201 and diffusing the liquefied organic emission material on the first non-emission region 200 into the first emission region 201. As a result, the liquefied organic emission materials can be disposed on different sub-pixels substantially without being mixed with one another, even when the resolution of the OLED display device becomes higher. Also, the structure of the first-sub pixel illustrated in FIG. 2 can be applied to the second sub-pixel in the same manner.

A method of forming an organic emission layer in a first sub-pixel of an OLED display device according to the first embodiment of the present invention will now be described with reference to FIGS. 3A and 3B.

Figure 3A:
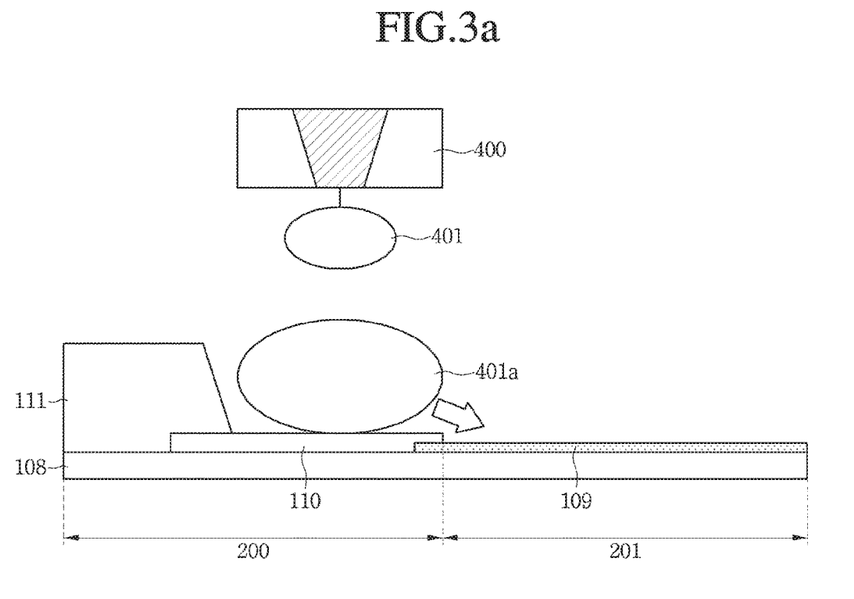
FIGS. 3A and 3B are cross-sectional views illustrating a method of forming an organic emission layer in a first sub-pixel of an OLED display device according to the first embodiment of the present invention.
Figure 3B:
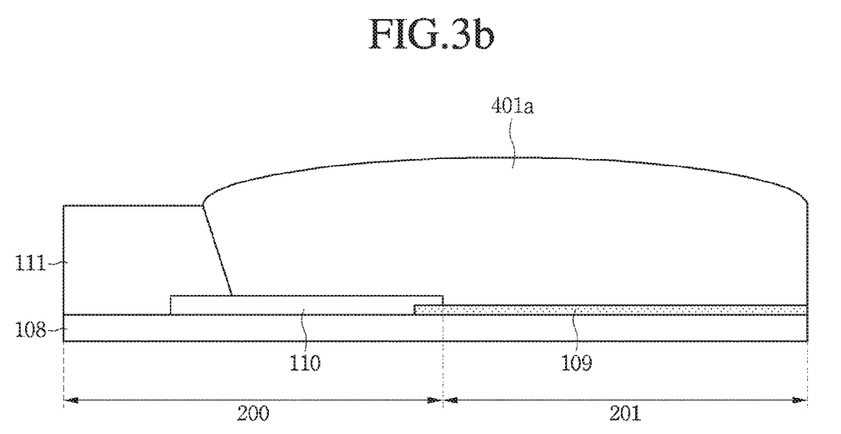

FIGS. 3A and 3B are cross-sectional views illustrating a method of forming an organic emission layer in a first sub-pixel of an OLED display device according to the first embodiment of the present disclosure.

Referring to FIGS. 3A and 3B, a first sub-pixel of the OLED display device includes a first emission region 201 and a first non-emission region 200. The first emission region 201 corresponds to a region which is occupied by an exposed upper surface of a first electrode 109 of an organic light emitting element through a first bank pattern 110. The first non-emission region 200 corresponds to a remaining region which is occupied by the first bank pattern 110 disposed on a planarization film 108. Also, the first non-emission region 200 includes a second bank pattern 111 which is disposed on the first bank pattern 110 and exposes a part of the upper surface of the first bank pattern 110.

In order to dispose an organic emission layer on the first emission region 201, a liquefied organic emission material 401 is discharged on the first non-emission region 200 through a nozzle 400. In other words, the nozzle 400 discharges the liquefied organic emission material 401 onto the upper surface of the first bank pattern 110 which is disposed in the first non-emission region 200 and exposed by the second bank pattern 111.

The liquefied organic emission material 401a discharged on the first bank pattern 110 diffuses into the first electrode 109 of the organic light emitting element which is disposed in the first emission region 201. As such, the liquefied organic emission material 401a is disposed on not only the first bank pattern 110 disposed in the first non-emission region 200 but also the first electrode 109 disposed in the first emission region 201. Such a diffusion of the liquefied organic emission material 401 results from the fact that the first bank pattern 110 and the first electrode 109 each are formed of hydrophilic materials with a high surface energy.

Also, the liquefied organic emission material 401a can be discharged on the second bank pattern 111. In this case, the discharged liquefied organic emission material 401a moves from the second bank pattern 111 into the first bank pattern 110, because the second bank pattern 111 is formed of a hydrophobic material with a low surface energy. As such, the liquefied organic emission material 401a can be disposed substantially on the first bank pattern 110 and the first electrode 109. In accordance therewith, an organic emission layer can be disposed on the first emission region 201 without directly discharging the liquefied organic emission material 401a on the first emission region 201.

Thereafter, the liquefied organic emission material 401a disposed on the first bank pattern 110 and the first electrode 109 is dried (or cured) and forms an organic emission layer. As such, the organic emission layer can be formed on the first bank pattern 110 in the first non-emission region 200 and the first electrode 109 in the first emission region 201.

In this manner, the OLED display device according to an embodiment of the present disclosure can be manufactured by allowing the liquefied organic emission material to be formed on the first bank pattern within the non-emission region of the sub-pixel region and then diffused onto the first electrode within the emission region due to the surface energies. In other words, even when the emission region has a narrower width and the liquefied organic emission material is not precisely discharged over the emission region, the OLED display device according to an embodiment of the present invention can form the organic emission layer in the emission region. Also, such a method of forming the organic emission layer can be applied to the second sub-pixel in the same or similar manner.

An OLED display device according to the second embodiment of the present invention will now be described in detail with reference to FIG. 4.

Figure 4:
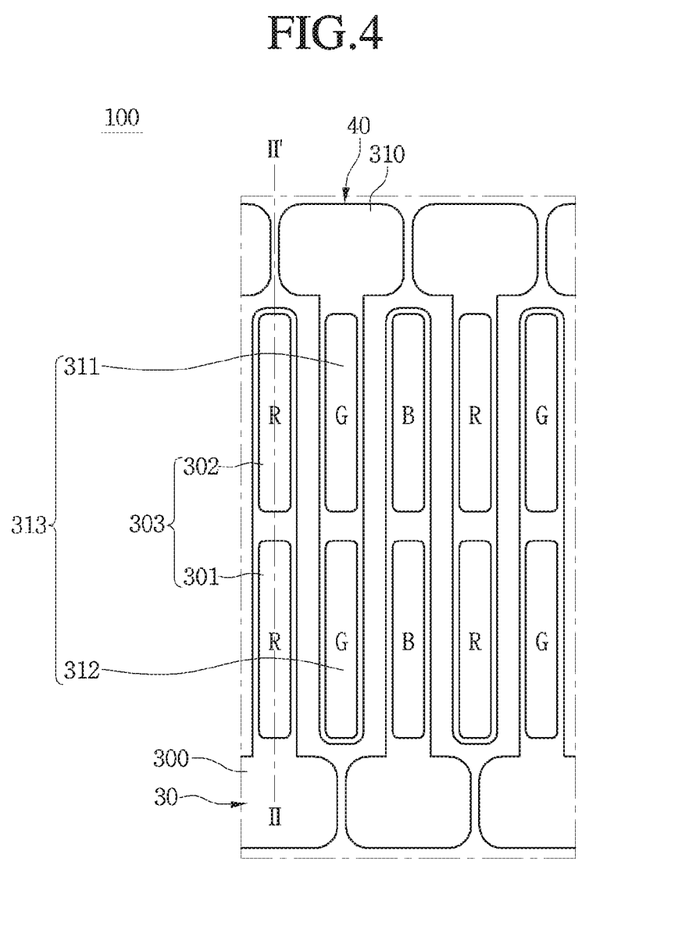
FIG. 4 is a planar view illustrating an OLED display device according to the second embodiment of the present invention.

FIG. 4 is a planar view illustrating an OLED display device according to the second embodiment of the present invention. The OLED display device of the second embodiment can include the same configuration as that of the first embodiment. As such, the description of the second embodiment overlapping with the first embodiment will be omitted. Components of the second embodiment having the same as those of the first embodiment will be referred to by the same reference numbers and characters.

Referring to FIG. 4, the OLED display device includes a plurality of sub-pixels arranged on a substrate 100. In detail, the OLED display device includes a plurality of first sub-pixels 30 and a plurality of second sub-pixels 40 which are arranged in a horizontal direction of the substrate 100.

The first sub-pixels 30 and the second sub-pixels 40 are arranged alternately with each other in the horizontal direction of the substrate 100. Also, each of the first and second sub-pixels 30 and 40 can become one of red, green and blue sub-pixels.

The first sub-pixel 30 includes an emission region (hereinafter, "first emission region") 303 and a non-emission region (hereinafter, "first non-emission region") 300. The first emission region 303 includes a first sub-emission region 301 and a second sub-emission region 302. The first sub-emission region 301 and the second sub-emission region 302 can be sequentially arranged in a vertical direction.

The second sub-pixel 40 includes an emission region (hereinafter, "second emission region") 313 and a non-emission region (hereinafter, "second non-emission region") 310. The second emission region 313 includes a third sub-emission region 311 and a fourth sub-emission region 312. The third sub-emission region 311 and the fourth sub-emission region 312 can be sequentially arranged on the vertical direction. Also, the first emission region 303 and the second emission region 313 are disposed between the first non-emission region 300 and the second non-emission region 310.

The first non-emission region 300 can have the same width as the second non-emission region 310. Also, the first emission region 303 can have the same width as the second emission region 313. As such, the first sub-emission region 301, the second sub emission region 302, the third non-emission region 311 and the fourth non-emission region 312 can have the same width as one another. The first non-emission region 300 and the second non-emission region 310 can be formed to have greater widths than those of the first emission region 303 and the second emission region 313.

A liquefied organic emission material can be discharged on the first non-emission region 300 and the second non-emission region 310. The liquefied organic emission material discharged on the first non emission region 300 and the second non-emission region 310 is diffused into the first emission region 303 and the second emission region 313.

The liquefied organic emission material can be diffused from the first non-emission region 300 into the first sub-emission region 301 and the second sub-emission region 302 because the first sub-emission region 301 and the second sub-emission region 302 of the first sub-pixel 40 are sequentially arranged in the vertical direction. Also, the liquefied organic emission material can be diffused from the second non-emission region 310 into the third sub-emission region 311 and the fourth sub-emission region 312, because the third sub-emission region 311 and the fourth sub-emission region 312 of the second sub-pixel 40 are sequentially arranged in the vertical direction.

In this manner, the OLED display device includes the first non-emission region 300 and the second non-emission region 310 which have greater widths than those of the first emission region 303 and the second emission region 313. As such, the liquefied organic emission materials are disposed on the first emission region 303 and the second emission region 313 substantially without being mixed with one another.

In detail, the organic emission material discharged on the first non-emission region 300 and the second non omission region 310 is diffused into the first emission region 303 and the second emission region 313. As such, the organic emission layer can be formed (or disposed) on the first emission region 303 and the second emission region 313 without directly discharging the organic emission material on the first emission region 303 and the second emission region 313.

The OLED display device according to the second embodiment of the present invention will now be described in detail with reference to FIG. 5.

Figure 5:
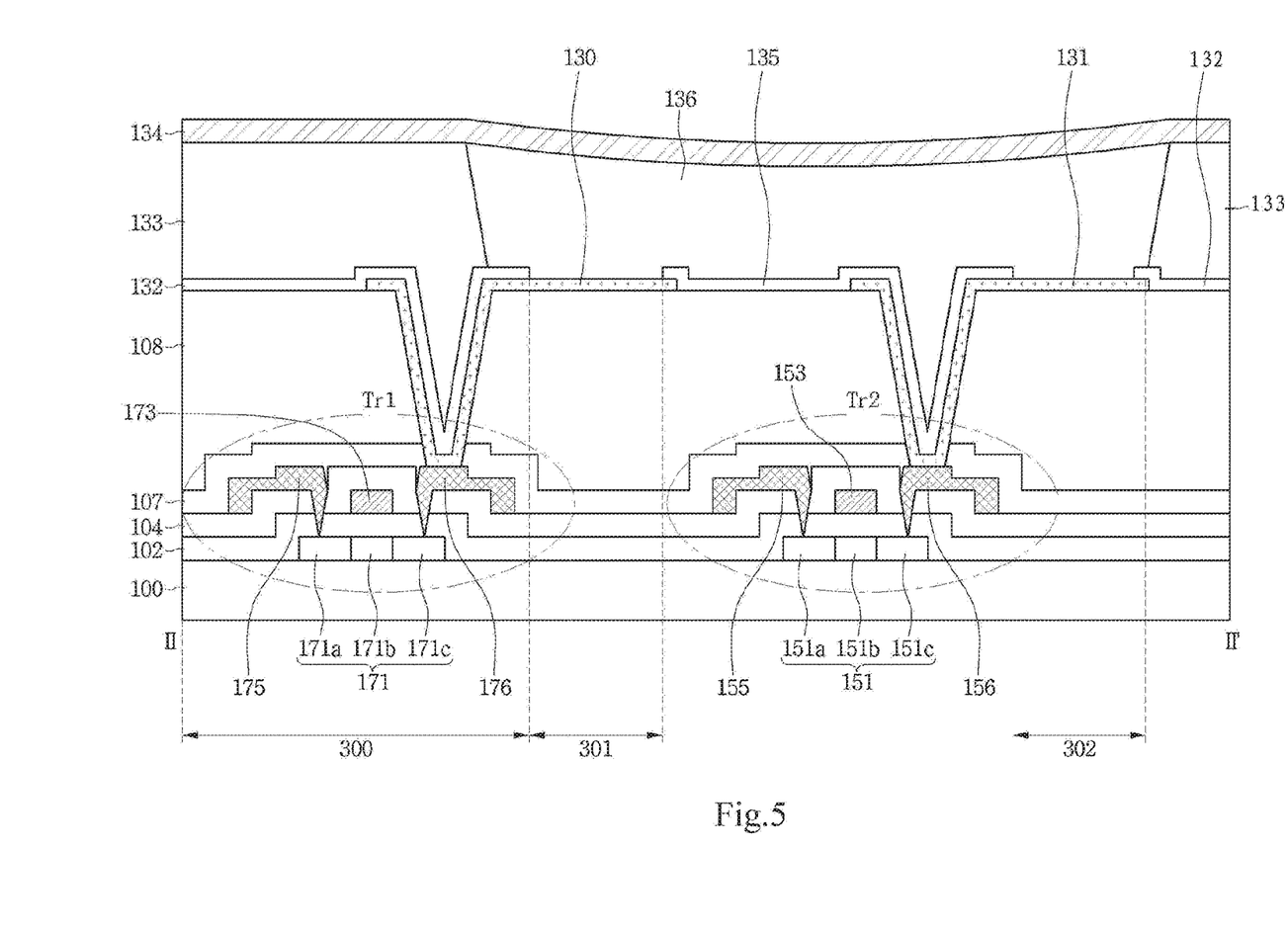
FIG. 5 is a cross-sectional view illustrating a first sub-pixel of the OLED display device taken along line II-II' in FIG. 4.

FIG. 5 is a cross-sectional view illustrating a first sub-pixel of the OLED display device taken along line II-II' in FIG. 4. The OLED display device according to the second embodiment of the present disclosure can include the same components as that of the first embodiment. As such, the description of the second embodiment overlapping with the first embodiment will be omitted. The components of the second embodiment having the same as those of the first embodiment will be referred to by the same reference numbers and characters.

Referring to FIG. 5, a first sub-pixel of the OLED display device includes a first non-emission region 300, a first sub-emission region 301 and a second sub-emission region 302.

The first sub-pixel includes a first thin film transistor Tr1, a second thin film transistor Tr2, first organic light emitting element and a second organic light emitting element which are disposed on a substrate 100. The first thin film transistor Tr1 includes a first semiconductor layer 171, a first gate electrode 173, a first source electrode 175 and a first drain electrode 176. The first semiconductor layer 171 includes a first source region 171a, a first channel region 171b and a first drain region 171c. The second thin film transistor Tr2 includes a second semiconductor layer 151, a second gate electrode 153, a second source electrode 155 and a second drain electrode 156. The second semiconductor layer 151 includes a second source region 151a, a second channel region 151b and a second drain region 151c.

The first organic light emitting element includes a first electrode 130 for the first organic light emitting element, an organic emission layer 136 and a second electrode. The second organic light emitting element includes another first electrode 131 for the second organic light emitting element, the organic emission layer 136 and the second electrode 134.

The first electrode 130 of the first organic light emitting element and the first electrode 131 of the second organic light emitting element are arranged on a planarization film 108 disposed over the first thin film transistor Tr1 and the second thin film transistor Tr2. Also, the first electrode 130 of the first organic light emitting element and the first electrode 131 of the second organic light emitting element are disposed on the planarization film 108 in such a manner as to be separate from each other.

A first bank pattern 132 and a third bank pattern 135 are arranged on the planarization film 108 which is provided with the first electrode 130 of the first organic light emitting element and the first electrode 131 of the second organic light emitting element. The first bank pattern 132 and the third bank pattern 135 can be disposed on the same layer and formed from the same material.

In detail, the first bank pattern 132 can be disposed in such a manner as to overlap with one edge of the first electrode 130 of the first organic light emitting element. The third bank pattern 135 can be disposed in such a manner as to overlap with the other edge of first electrode 130 of the first organic light emitting element opposite to the first bank pattern 132. Also, the third bank pattern 135 overlapping with the first electrode 130 of the first organic light emitting element can be expanded onto one edge of the first electrode 131 of the second organic light emitting element. Moreover, the first bank pattern 132 can be expanded onto the other edge of the first electrode 131 of the second organic light emitting element opposite to the third bank pattern 135. In other words, the third bank pattern 135 is disposed between the first electrode 130 of the first organic light emitting element and the first electrode 131 of the second light emitting element which are separate from each other.

A second bank pattern 133 is disposed on a part of the upper surface of the first bank pattern 132 overlapping with not only one edge of the first electrode 130 of the first organic light emitting element but also one edge of the first electrode 131 of the second organic light emitting element.

The organic emission layer 136 formed from a liquefied organic emission material is disposed in a region which is surrounded with the second bank pattern 133. In other words, the organic emission layer 136 is disposed on the first electrode 130 of the first organic light emitting element, the first electrode 131 of the second organic light emitting element and the third bank pattern 135. The second electrode 134 for the first and second organic light emitting elements is disposed on the substrate 100 provided with the organic emission layer 136.

The first bank pattern 132 and the third bank pattern 135 can define the first sub-emission region 301 and the second sub-emission region 302. In detail, the first sub-emission region 301 becomes a part of the upper surface of the first electrode 130 of the first organic light emitting element exposed by the first bank pattern 132 and the third bank pattern 135. The second sub-emission region 302 becomes a part of the upper surface of the first electrode 131 of the second organic light emitting element exposed by the first bank pattern 132 and the third bank pattern 135.

A region occupied by the first thin film transistor Tr1 can become the first non-emission region 300. The first non-emission region 300 includes the first bank pattern 132 overlapping with one edge of the first electrode 130 of the first organic light emitting element.

A liquefied organic emission material is discharged on the first bank pattern 132 which is disposed in the first non-emission region 300. The discharged liquefied-organic emission material is diffused from the first bank pattern 132, which overlaps with one edge of the first electrode 130 of the first organic light emitting element, into the first bank pattern 132 overlapping with one edge of the first electrode 131 of the second organic light emitting element.

As such, the same organic emission layer 136 can be disposed on the first sub-emission region 301 and the second sub-emission region 302. In accordance therewith, a procedure of disposing (or forming) the organic emission layer 136 on the first sub-emission region 301 and the second sub-emission region 302 can be simplified.

In other words, the third bank pattern 135 is disposed between the first electrode 130 of the first organic light emitting element and the first electrode 131 of the second organic light emitting element. As such, the two sub-emission regions can be driven using a single organic emission layer 136. Such a structure illustrated in FIG. 5 can be applied to not only the first sub-pixel but also the second sub-pixel in the same or similar manner.

A method of forming an organic emission layer in a first sub-pixel of an OLED display device according to the second embodiment of the present invention will now be described in detail with reference to FIGS. 6A and 6B.

Figure 6A:
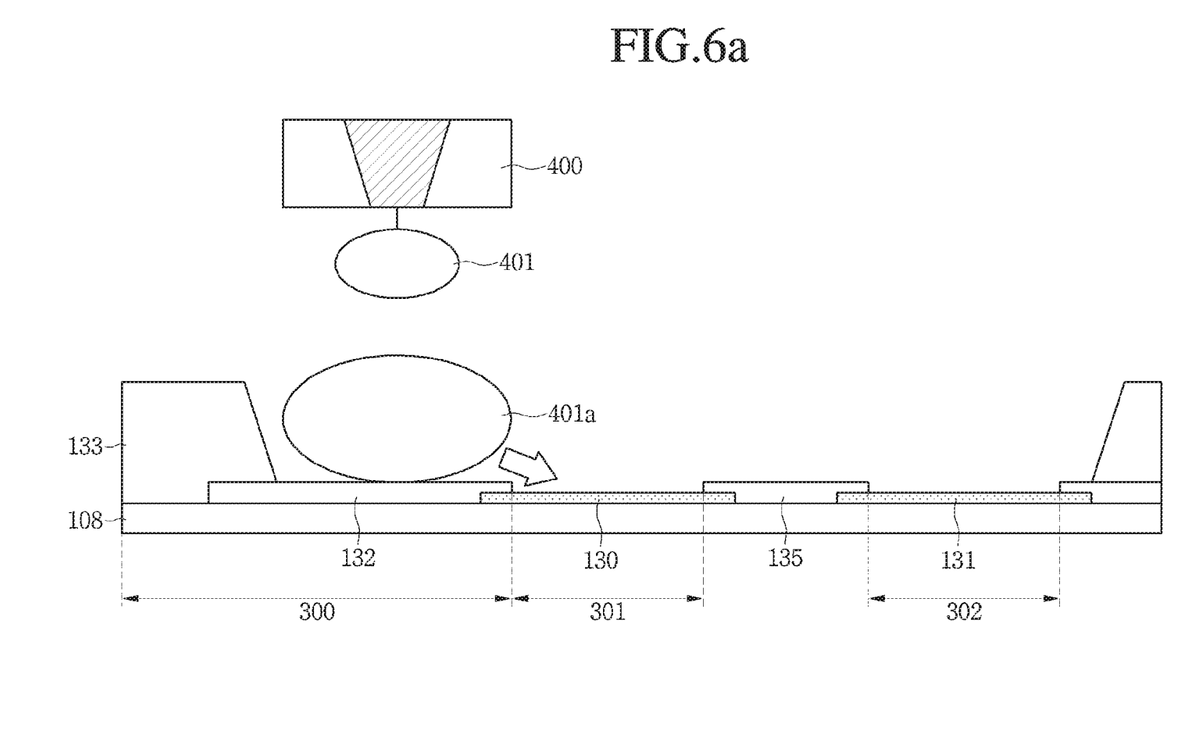
FIGS. 6A and 6B are cross-sectional views illustrating a method of forming an organic emission layer in a first sub-pixel of an OLED display device according to the second embodiment of the present invention.
Figure 6B:
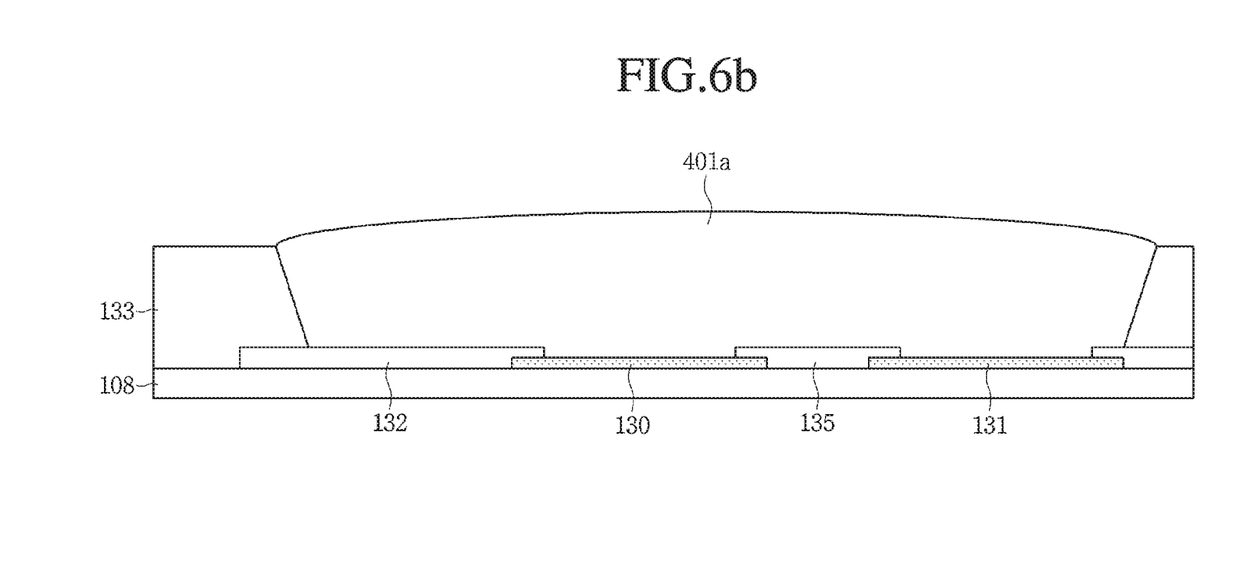

FIGS. 6A and 6B are cross-sectional views illustrating a method of forming an organic emission layer in a first sub-pixel of an OLED display device according to the second embodiment of the present invention. The OLED display device according to the second embodiment of the present invention can include the same components as that of the first embodiment. As such, the description of the second embodiment overlapping with the first embodiment will be omitted. The components of the second embodiment having the same as those of the first embodiment will be referred to by the same reference numbers and characters.

Referring to FIGS. 6A and 6B, a first sub-pixel of an OLED display device according to the second embodiment of the present invention includes a first non-emission region 300 and a first emission region 303. The first non-emission region 300 can be formed to have a greater width than that of the first emission region 303.

The first emission region 303 includes a first sub-emission region 301 and a second sub-emission region 302 which are disposed apart from each other. In this case, a third bank pattern 135 is disposed between the first sub-emission region 301 and the second sub-emission region 302.

In order to dispose (or form) an organic emission layer on the first emission region 303, a liquefied organic emission material 401 is discharged on the first non-emission region 300 through a nozzle 400. In other words, the nozzle 400 discharges the liquefied organic emission material 401 onto the upper surface of the first bank pattern 132 which is disposed in the first non-emission region 300 and exposed by the second bank pattern 133.

The liquefied organic emission material 401a discharged on the first bank pattern 132 is diffused from the first bank pattern 132, which overlaps with one edge of the first electrode 130 of the first organic light emitting element disposed on the first sub-emission 301, into the first bank pattern 132 overlapping with one edge of the first electrode 131 of the second organic light emitting element on the second stab-emission region 302. Such a diffusion of the liquefied organic emission material 401a can be performed because each of the first bank pattern 132 and the first electrodes 130 and 131 of the organic light emitting elements is formed of a hydrophilic material with a high surface energy. Also, the liquefied organic emission material 401a can be diffused on the third bank pattern 135 because the third bank pattern 135 is formed from the same material in the same layer as the first bank pattern 132.

Thereafter, the liquefied organic emission material disposed on the first bank pattern 132 and the first electrodes 130 and 131 of the organic light emitting elements is dried (or cured) and an organic emission layer is formed.

Although the emission region in a high definition OLED display device has a narrow width and the liquefied organic emission material is not precisely discharged over the emission region, the OLED display device according to an embodiment of the present invention can form the organic emission layer in the emission region. Also, such a method of forming the organic emission layer can be applied to the second sub-pixel in the same or similar manner.

An OLED display device according to the third embodiment of the present invention will now be described in detail with reference to FIG. 7.

Figure 7:
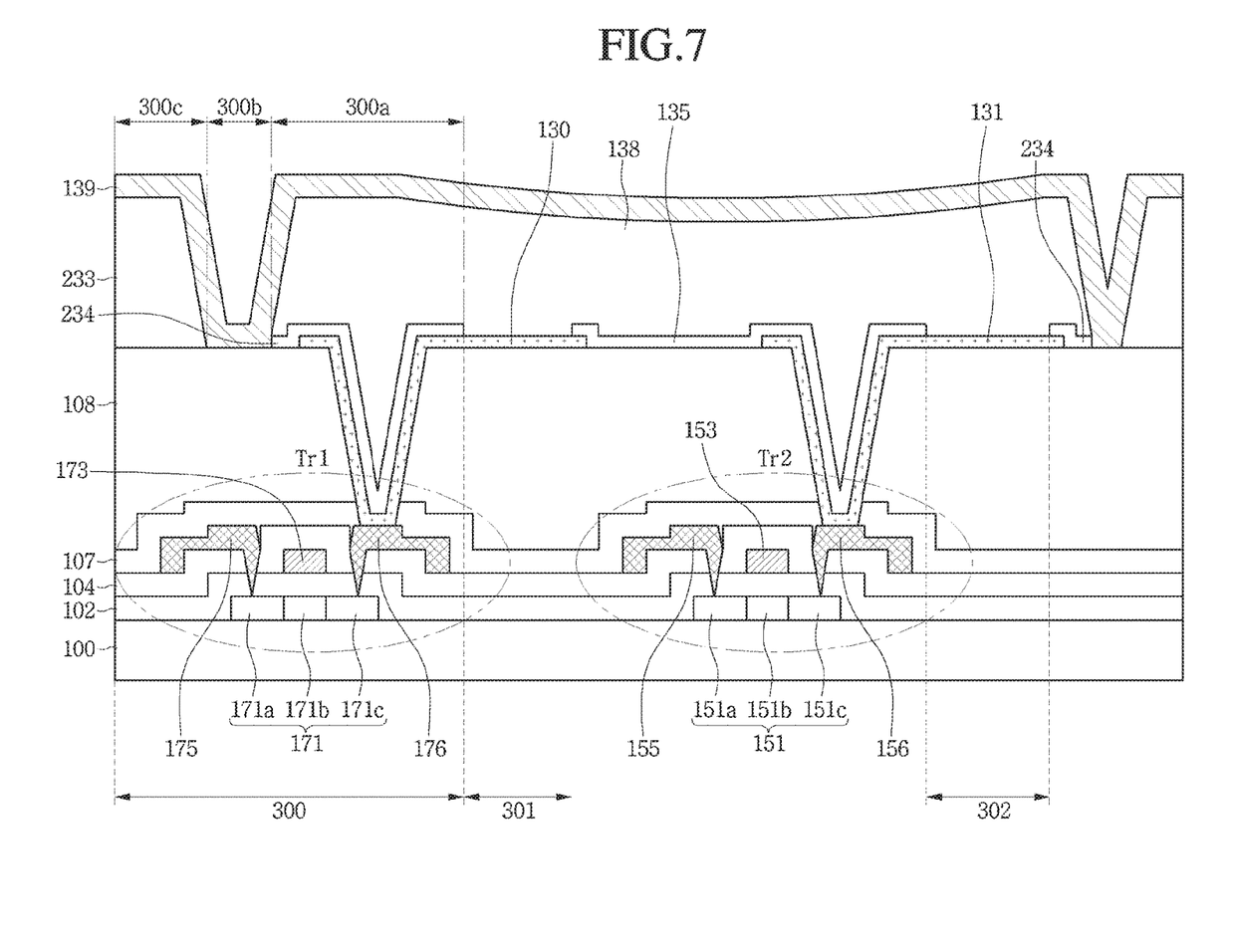
FIG. 7 is a cross-sectional view illustrating a first sub-pixel of an OLED display device according to the third embodiment of the present invention.

FIG. 7 is a cross-sectional view illustrating a first sub-pixel of an OLED display device according to the third embodiment of the present invention. The OLED display device according to the third embodiment of the present invention can include the same components as that of the previous embodiments. As such, the description of the third embodiment overlapping with the previous embodiments will be omitted. The components of the third embodiment having the same as those of the previous embodiments will be refuted to by the same reference numbers and characters.

Referring to FIG. 7, a first sub-pixel of an OLED display device according to the third embodiment of the present invention includes a first non-emission region 300, a first sub-emission region 301 and a second sub-emission region 302. The first non-emission region 300 includes a first pattern formation region 300a, a second pattern formation region 300c and a pattern absence region 300b.

A first bank pattern 234 is disposed on the first pattern formation region 300a of the first non-emission region 300. A second bank pattern 233 is disposed on the second pattern formation region 300c of the first non-emission region 300. The first pattern formation region 300a and the second pattern formation region 300c are defined in such a manner as to be separate from each other.

The pattern absence region 300c is provided between the first pattern formation region 300a and the second pattern formation region 300c. As such, the pattern absence region 300c exposes a planarization film 108.

The first bank pattern 234 is disposed in such a manner as to overlap with one edge of a first electrode 131 of a first organic light emitting element. The third bank pattern 135 is disposed in such a manner as to overlap with the other edge of the first electrode 131 of the first organic light emitting element opposite to the first bank pattern 234. Also, the third bank pattern 135 overlapping with the first electrode 130 of the first organic light emitting element can be disposed in such a manner as to expand onto one edge of a first electrode 131 of a second organic light emitting element. Moreover, the first bank pattern 234 can be disposed in such a manner as to overlap with the other edge of the first electrode 131 of the second organic light emitting element.

An organic emission layer 138 is disposed on the first bank pattern 234, the first electrode 130 of the first organic light emitting element, the third bank pattern 135 and the first electrode 131 of the second organic light emitting element.

In order to form the organic emission layer 138, a liquefied organic emission material is discharged on the first bank pattern 234 which is disposed in the first pattern formation region 300a of the first non-emission region 300. The liquefied organic emission material discharged in the first pattern formation region is diffused onto the first bank pattern 131, which overlaps with the first electrode 131 of the second organic light emitting element, through the first electrode 130 of the first organic light emitting element, the third bank pattern 135 and the first electrode 131 of the second organic light emitting element.

As a result, the first bank pattern 234 disposed on the first pattern formation region 300a which is separate from the second pattern formation region 300c can be used to inject the liquefied organic emission material into the first emission region 301 and the second emission region 302. As such, the same organic emission layer 136 can be disposed on the first sub-emission region 301 and the second sub-emission region 302. In accordance therewith, a procedure of disposing (or forming) the organic emission layer 138 on the first sub-emission region 301 and the second sub-emission region 302 can be simplified.

Meanwhile, the planarization film 108 exposed in the pattern absence region 300b is formed from a hydrophobic insulation material. As such, the liquefied organic emission material may not be diffused into the pattern absence region 300b.

A second electrode 139 for the first and second organic light emitting elements is disposed on an entire surface of the substrate 100 provided with the organic emission layer 138.

In this manner, the OLED display device according to an embodiment of the present invention is manufactured by allowing the third bank pattern 135 to be disposed between the first electrode 130 of the first organic light emitting element and the first electrode 131 of the second organic light emitting element. As such, the two sub-emission regions can be driven using a single organic emission layer 138. Such a structure illustrated in FIG. 7 can be applied to the second sub-pixel in the same or similar manner.

A method of forming an organic emission layer in a first sub-pixel of an OLED display device according to the third embodiment of the present invention will now be described in detail with reference to FIGS. 8A and 8B.

Figure 8A:
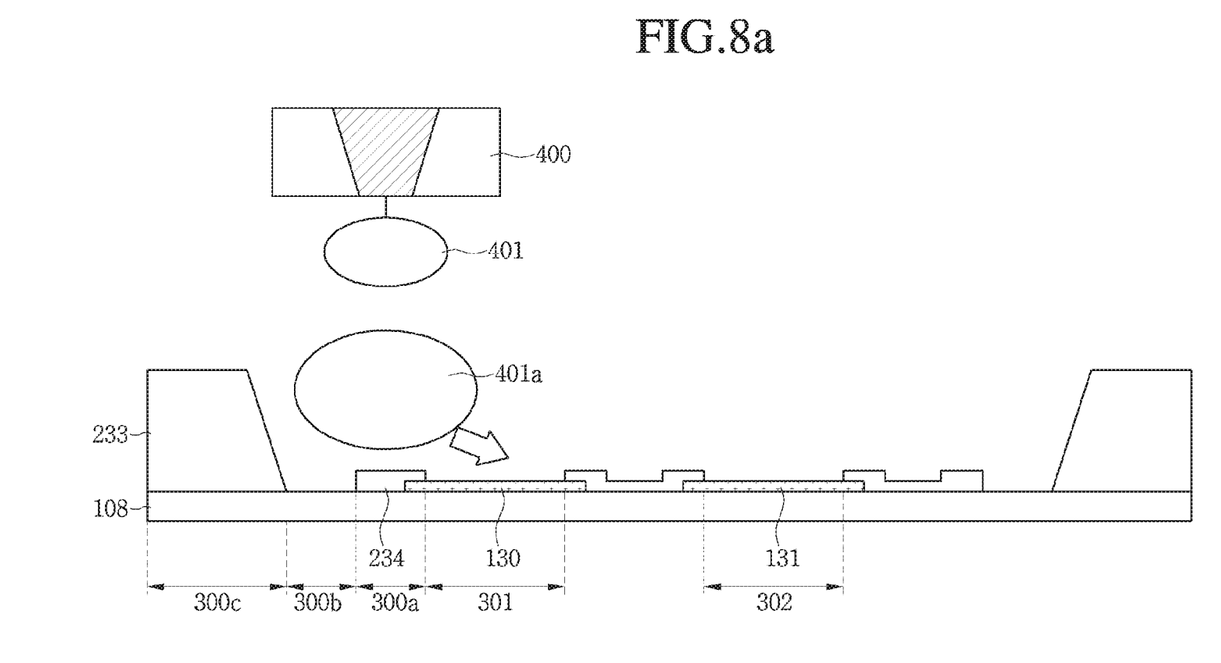
FIGS. 8A and 8B are cross-sectional views illustrating a method of forming an organic emission layer in a first sub-pixel of an OLED display device according to the third embodiment of the present invention.
Figure 8B:
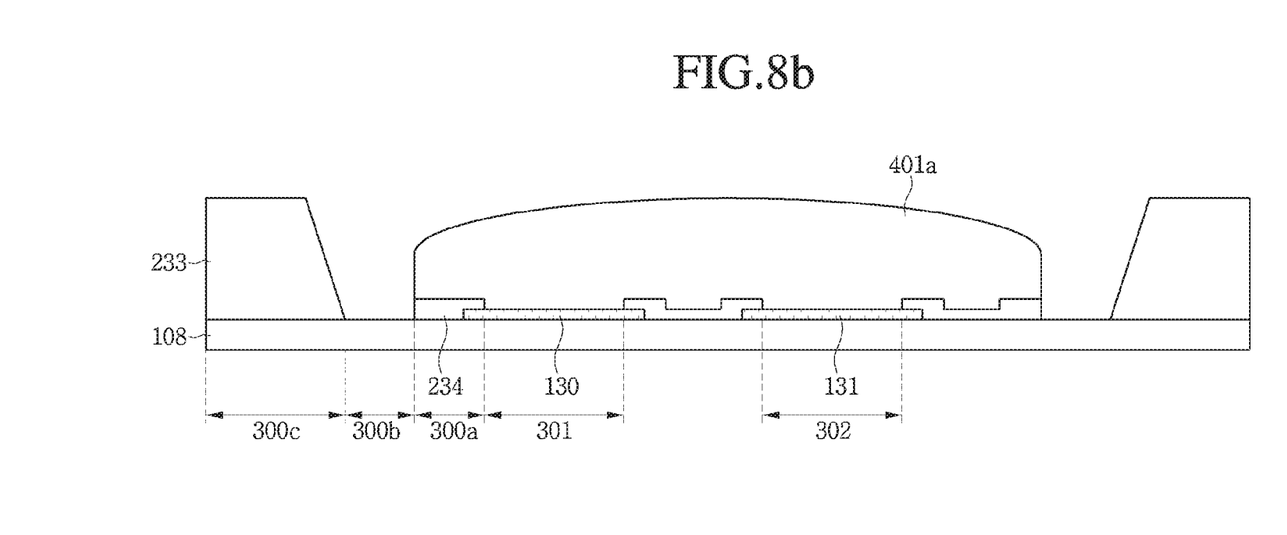

FIGS. 8A and 8B are cross-sectional views illustrating a method of forming an organic emission layer in a first sub-pixel of an OLED display device according to the third embodiment of the present invention. The OLED display device according to the third embodiment of the present invention can include the same components as those of the previous embodiments. As such, the description of the third embodiment overlapping with the previous embodiments will be omitted. The components of the third embodiment having the same as those of the previous embodiments will be referred to by the same reference numbers and characters.

Referring to FIGS. 8A and 8B, a first sub-pixel of an OLED display device according to the third embodiment of the present invention includes a first non-emission region and a first emission region. The first non-emission region includes a first pattern formation region 300$a$, a second pattern formation region 300$c$ and a pattern absence region 300$b$. The first emission region includes a first sub-emission region 301 and a second sub-emission region 302.

A first bank pattern 234 is disposed on the first pattern formation region 300$a$ of the first non-emission region. A second bank pattern 233 is disposed on the second pattern formation region 300$c$ of the first non-emission region.

An organic emission layer is disposed on the first sub-emission region 301 and the second sub-emission region 302. To this end, a liquefied organic emission material is disposed on the first pattern formation region 300$a$ using a nozzle 400. In detail, the liquefied organic emission material 401$a$ discharged from the nozzle 400 is disposed on the upper surface of the first bank pattern 234 which covers the first pattern formation region 300$a$.

The liquefied organic emission material 401 discharged on the first bank pattern 234 is diffused from the first bank pattern 234, which overlaps with one edge of the first electrode 130 of the first organic light emitting element disposed in the first sub-emission region 301, onto the first bank pattern overlapping with one edge of the first electrode of the second organic light emitting element. The liquefied organic emission material can be diffused on the surfaces of the first bank pattern 234 and the first electrodes of the organic light emitting elements because the first bank pattern 234 and the first electrodes of the organic light emitting elements each are formed of a hydrophilic material with a high surface energy. Also, the liquefied organic emission material can be diffused on the third bank pattern 135 because the third bank pattern 135 is formed from the same material and in the same layer as the first bank pattern 234.

Although the emission region in a high definition OLED display device has a narrow width and the liquefied organic emission material is not precisely discharged over the emission region, the OLED display device according to an embodiment of the present invention can form the organic emission layer in the emission region. Also, such a method of forming the organic emission layer can be applied to the second sub-pixel in the same or similar manner.

It will be apparent to those skilled in the an that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an organic light emitting diode (OLED) display device having a thin film transistor array substrate, the method comprising:
    forming a plurality of first sub-pixels on a substrate, wherein each of the plurality of first sub-pixels includes a first emission region and a first non-emission region;
    forming a plurality of second sub-pixels, wherein the second sub-pixels are adjacent to the first sub-pixels, and wherein each of the plurality of second sub-pixels includes a second emission region and a second non-emission region;
    forming a first bank pattern with a hydrophilic inorganic insulation material in the first and second non-emission regions;
    forming a second bank pattern with a hydrophobic organic insulation material on an upper surface of the first bank pattern; and
    forming an organic emission layer on the first and second emission regions,
    wherein each of the plurality of first sub-pixels comprises a first horizontal portion and a first vertical portion perpendicular to the first horizontal portion, and each of the plurality of second sub-pixels comprises a second horizontal portion and a second vertical portion perpendicular to the second horizontal portion,
    wherein the first horizontal portion is the first non-emission region of the first sub-pixel and the first vertical portion is the first emission region of the first sub-pixel, and the first horizontal portion is wider than the first vertical portion.

2. The method of claim 1, wherein the first and second emission regions are disposed between the first non-emission region and the second non-emission region.

3. The method of claim 1, wherein the pluralities of first sub-pixels and second sub-pixels are arranged alternately with each other in the first direction.

4. The method of claim 1, wherein the second horizontal portion is the second non-emission region and the second vertical portion is the second emission region, and the second horizontal portion is wider than the second vertical portion.

5. The method of claim 1, wherein the first emission region includes a first sub-emission region and a second sub-emission region, and the second emission region includes a third sub-emission region and a fourth sub-emission region.

6. The method of claim 5, wherein the first and second sub-emission regions are sequentially disposed in a vertical direction and the third and fourth sub-emission regions are sequentially disposed in another vertical direction.

7. The method of claim 6, further comprises forming a third bank pattern, which are disposed between the first and second sub-emission regions and between the third and fourth sub-emission regions, before the formation of the organic emission layer.

8. The method of claim 7, wherein the third bank pattern is disposed in the same layer and formed from the same material as the first bank pattern.

9. The method of claim 1, wherein each of the first and second non-emission regions includes:
    a first pattern formation region on which a first bank pattern is disposed;
    a second pattern formation region on which a second bank pattern is disposed; and
    a pattern absence region.

10. The method of claim 9, wherein the first and second pattern formation regions are disposed apart from each other.

11. The method of claim 9, wherein the pattern absence region is disposed between the first and second pattern formation regions.

12. The method of claim 1, wherein the formation of the organic emission layer includes:

discharging a liquefied organic emission material on the first bank pattern; and enabling the liquefied organic emission material discharged on the first bank pattern to be diffused onto one of the emission regions of the first and second sub-pixels.

* * * * *